(12) United States Patent
Blank et al.

(10) Patent No.: US 11,114,384 B2
(45) Date of Patent: Sep. 7, 2021

(54) OXIDE-PEELING STOPPER

(71) Applicant: Infineon Technologies Austria AG, Villach (AT)

(72) Inventors: Oliver Blank, Villach (AT); Christof Altstaetter, Villach (AT); Ingmar Neumann, Villach (AT); Rudolf Rothmaler, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 16/159,372

(22) Filed: Oct. 12, 2018

(65) Prior Publication Data

US 2019/0115302 A1 Apr. 18, 2019

(30) Foreign Application Priority Data

Oct. 13, 2017 (DE) .......................... 102017123846.8

(51) Int. Cl.
| | |
|---|---|
| *H01L 23/544* | (2006.01) |
| *H01L 29/78* | (2006.01) |
| *H01L 29/00* | (2006.01) |
| *H01L 21/78* | (2006.01) |
| *H01L 23/58* | (2006.01) |
| *B23K 26/38* | (2014.01) |
| *H01L 23/538* | (2006.01) |
| *H01L 23/00* | (2006.01) |

(52) U.S. Cl.
CPC ............ *H01L 23/544* (2013.01); *B23K 26/38* (2013.01); *H01L 21/78* (2013.01); *H01L 21/7806* (2013.01); *H01L 23/5386* (2013.01); *H01L 23/562* (2013.01); *H01L 23/585* (2013.01); *H01L 29/00* (2013.01); *H01L 29/7813* (2013.01)

(58) Field of Classification Search
CPC ............ H01L 29/0649; H01L 23/3192; H01L 23/5226; H01L 21/762; H01L 21/76877; H01L 21/78; H01L 21/7806; H01L 23/544; H01L 23/5386; H01L 23/562; H01L 23/585; H01L 29/00; H01L 29/7813
USPC ......................................... 257/750, 758, 620
See application file for complete search history.

(56) References Cited

U.S. PATENT DOCUMENTS

| | | | | |
|---|---|---|---|---|
| 5,530,280 | A * | 6/1996 | White ................... | H01L 23/562 257/508 |
| 6,951,801 | B2 * | 10/2005 | Pozder .............. | H01L 21/32134 257/E21.238 |
| 7,598,154 | B2 * | 10/2009 | Izumi ..................... | B28D 5/022 438/113 |
| 8,354,735 | B2 * | 1/2013 | Lee ........................ | H01L 23/562 257/620 |

(Continued)

FOREIGN PATENT DOCUMENTS

| | | |
|---|---|---|
| DE | 102009042711 A1 | 4/2010 |
| EP | 0605806 A2 | 7/1994 |

*Primary Examiner* — Luan C Thai
(74) *Attorney, Agent, or Firm* — Murphy, Bilak & Homiller, PLLC

(57) ABSTRACT

A power semiconductor die has a semiconductor body, an insulation layer on the semiconductor body, a passivation structure arranged above the insulation layer so as to expose a first insulation layer subsection that extends to an edge of the power semiconductor die, and an interruption structure in the first insulation layer subsection.

19 Claims, 8 Drawing Sheets

(56) References Cited

U.S. PATENT DOCUMENTS

| | | | |
|---|---|---|---|
| 8,704,336 B2* | 4/2014 | He | H01L 22/32 |
| | | | 257/620 |
| 2003/0080432 A1* | 5/2003 | Higashi | H01L 21/76834 |
| | | | 257/758 |
| 2004/0256726 A1* | 12/2004 | Harada | H01L 21/76808 |
| | | | 257/758 |
| 2006/0157766 A1* | 7/2006 | Won | H01L 28/60 |
| | | | 257/296 |
| 2008/0042286 A1* | 2/2008 | Fujimaki | H01L 23/5223 |
| | | | 257/758 |
| 2011/0316161 A1* | 12/2011 | Ohtake | H01L 21/76802 |
| | | | 257/758 |
| 2012/0018889 A1* | 1/2012 | Vannier | H01L 21/76843 |
| | | | 257/758 |
| 2012/0104615 A1* | 5/2012 | Louis | H01L 23/481 |
| | | | 257/758 |
| 2014/0015112 A1* | 1/2014 | Watanabe | H01L 21/78 |
| | | | 257/620 |
| 2015/0084164 A1* | 3/2015 | Tomita | H01L 23/522 |
| | | | 257/620 |
| 2017/0098616 A1 | 4/2017 | Kaltalioglu et al. | |

\* cited by examiner

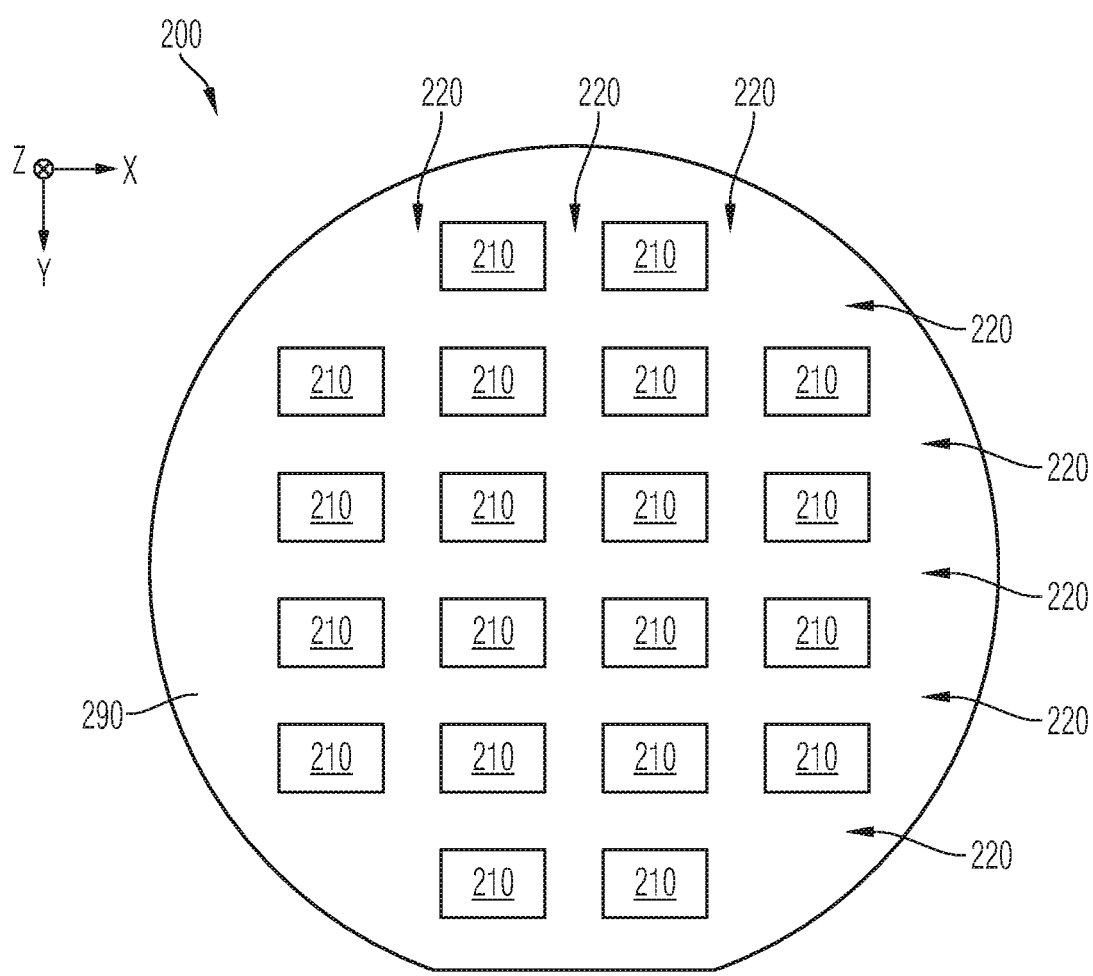

OXIDE-PEELING STOPPER

TECHNICAL FIELD

This specification refers to embodiments of a power semiconductor die, to embodiments of a semiconductor wafer and to embodiments of a method of processing a semiconductor wafer. In particular, this specification relates to embodiments of a power semiconductor die that comprises means for blocking an oxide-peeling that may occur during a wafer dicing processing step.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a power semiconductor die configured to conduct a load current along a load current path between two load terminals of the die. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state.

Regarding the manufacturing process, a plurality of power semiconductor dies are usually simultaneously processed within a single wafer; i.e., after having been processed, the semiconductor wafer may include a plurality of power semiconductor dies.

The wafer is then subjected to a separation processing step, e.g., a dicing step, and the wafer is divided into the plurality of separate dies. After a quality check, the dies may then be enclosed in packages and thereafter be delivered to the customer.

Said quality check may include checking, if the die has been damaged during the separation processing step. For example, during dicing, an insulation layer that was exposed to the dicing (e.g., laser dicing) may become damaged.

For example, if considered to be damaged or, respectively, if it cannot reliably ensured that the die has not been damaged, the die is not packaged but discarded.

SUMMARY

Certain aspects of the present specification are related to a visibly arranged interruption structure configured, e.g., for blocking a peeling off of an insulation layer.

According to an embodiment, a power semiconductor die has a semiconductor body; an insulation layer on the semiconductor body; a passivation structure arranged above the insulation layer and so as to expose a first insulation layer subsection that extends to an edge of the power semiconductor die; and an interruption structure in the first insulation layer subsection.

According to a further embodiment, a semiconductor wafer includes a semiconductor body; an insulation layer on the semiconductor body; a die region with a power semiconductor die; a dicing region arranged adjacent to the die region; a passivation structure arranged above the insulation layer and so as to expose a section of the insulation layer, wherein a first subsection of the exposed insulation layer section extends into the die region and wherein a second subsection of the exposed insulation layer section extends into the dicing region; and an interruption structure in the first insulation layer subsection.

According to a yet further embodiment, a method comprises: providing a semiconductor wafer. The provided semiconductor wafer has: a semiconductor body; an insulation layer on the semiconductor body; a die region with a power semiconductor die; a dicing region arranged adjacent to the die region; a passivation structure arranged above the insulation layer and so as to expose a section of the insulation layer, wherein a first subsection of the exposed insulation layer section extends into the die region and wherein a second subsection of the exposed insulation layer section extends into the dicing region; and an interruption structure in the first insulation layer subsection. The method further comprises dicing the semiconductor wafer along the dicing region while at least partially maintaining the interruption structure.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals may designate corresponding parts. In the drawings:

FIG. 2 schematically and exemplarily illustrates a section of a horizontal projection of a semiconductor wafer in accordance with some embodiments;

DETAILED DESCRIPTION

Figure 1:
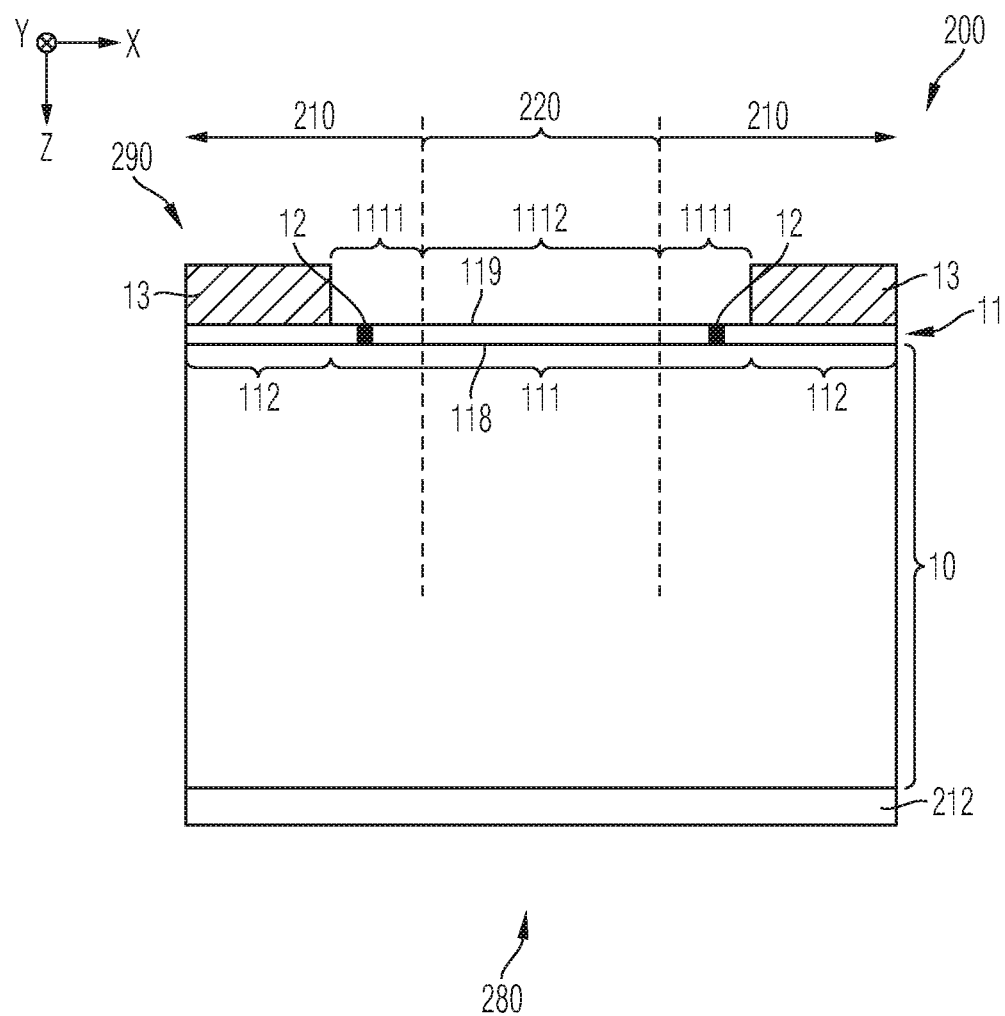
FIG. 1 schematically and exemplarily illustrates a section of a vertical cross-section of a semiconductor wafer in accordance with some embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor die, e.g., a power semiconductor die that may be used within a power converter or a power supply. Thus, in an embodiment, such die can be configured to carry a load current that is to be fed to a load and/or, respectively, that is provided by a power source. For example, the die may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. A plurality of such diode cells and/or such transistor cells may be integrated in the die.

The term "power semiconductor die" as used in this specification intends to describe a single die with high voltage blocking and/or high current-carrying capabilities. In other words, such power semiconductor die is intended for high current, typically in the Ampere range, e.g., up to 5 or 100 Amperes, and/or voltages typically above 15 V, more typically up to 40 V, and above, e.g., up to at least 500 V or more than 500 V, e.g. at least 600 V or at least a few kV, e.g., in case of a high power IGBT.

For example, the power semiconductor die described below may be a die that is configured to be employed as a power component in a low-, medium- and/or high voltage application. For example, the term "power semiconductor die" as used in this specification is not directed to logic semiconductor devices that are used for, e.g., storing data, computing data and/or other types of semiconductor based data processing.

FIG. 1 schematically and exemplarily illustrates a vertical cross-section of a semiconductor wafer 200 and FIG. 2 schematically and exemplarily illustrates horizontal projection of the semiconductor wafer 200 in accordance with one or more embodiments. In the following, it will be referred to both FIG. 1 and FIG. 2.

The semiconductor wafer 200 has a semiconductor body 10. For example, the semiconductor body 10 is based on silicon (Si). In another embodiment, the semiconductor body 10 is based on a different material, e.g. silicon carbide (SiC), gallium nitride (GaN), gallium arsenide (GaAs) or another wide bandgap material.

A thickness of the semiconductor body 10 along the vertical direction Z may be within the range of 20 μm to 1000 μm. In an embodiment, the semiconductor body thickness 10 is below a maximum value, e.g., so as to allow for separation by means of laser dicing, e.g., below 200 μm or below 100 μm. A diameter of the semiconductor wafer (in the following also simply referred to as "wafer"), e.g., along the first lateral direction X, may be within range of 1 to 20 inches, e.g., up to 14 inches, in accordance with an embodiment.

The wafer 200 may include one or more die regions 210, and one or more dicing regions 220 arranged adjacent to the diode regions 210, e.g. laterally adjacent to the diode regions 210.

Figure 3A:
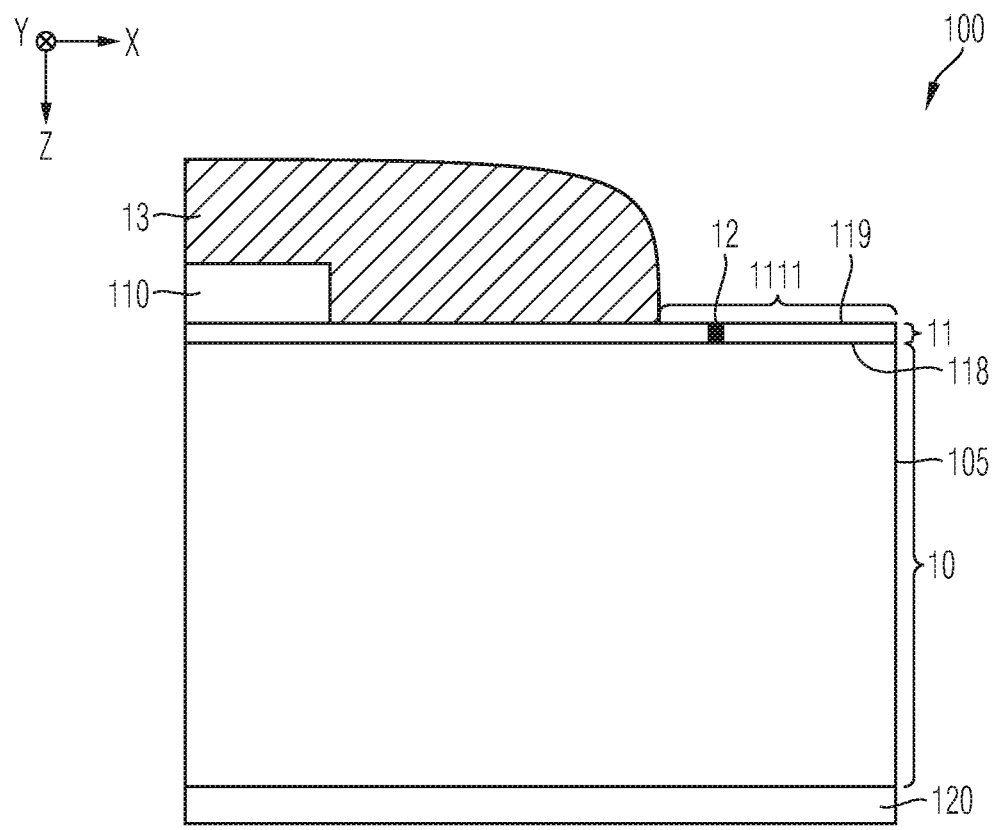
FIG. 3A schematically and exemplarily illustrates a section of a vertical cross-section of a power semiconductor die in accordance with some embodiments.
Figure 3B:
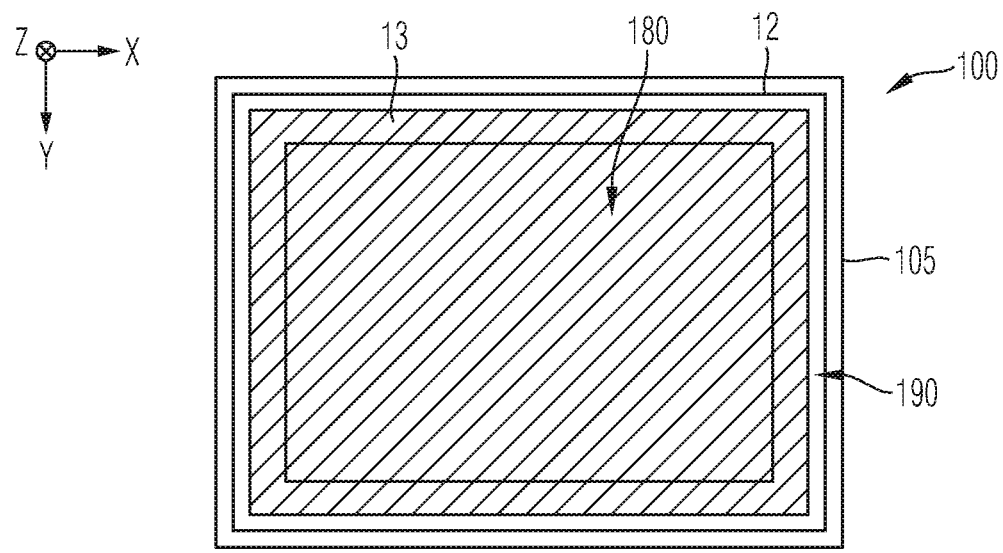
FIG. 3B schematically and exemplarily illustrates a section of a horizontal projection of a power semiconductor die in accordance with some embodiments.
Figure 7:
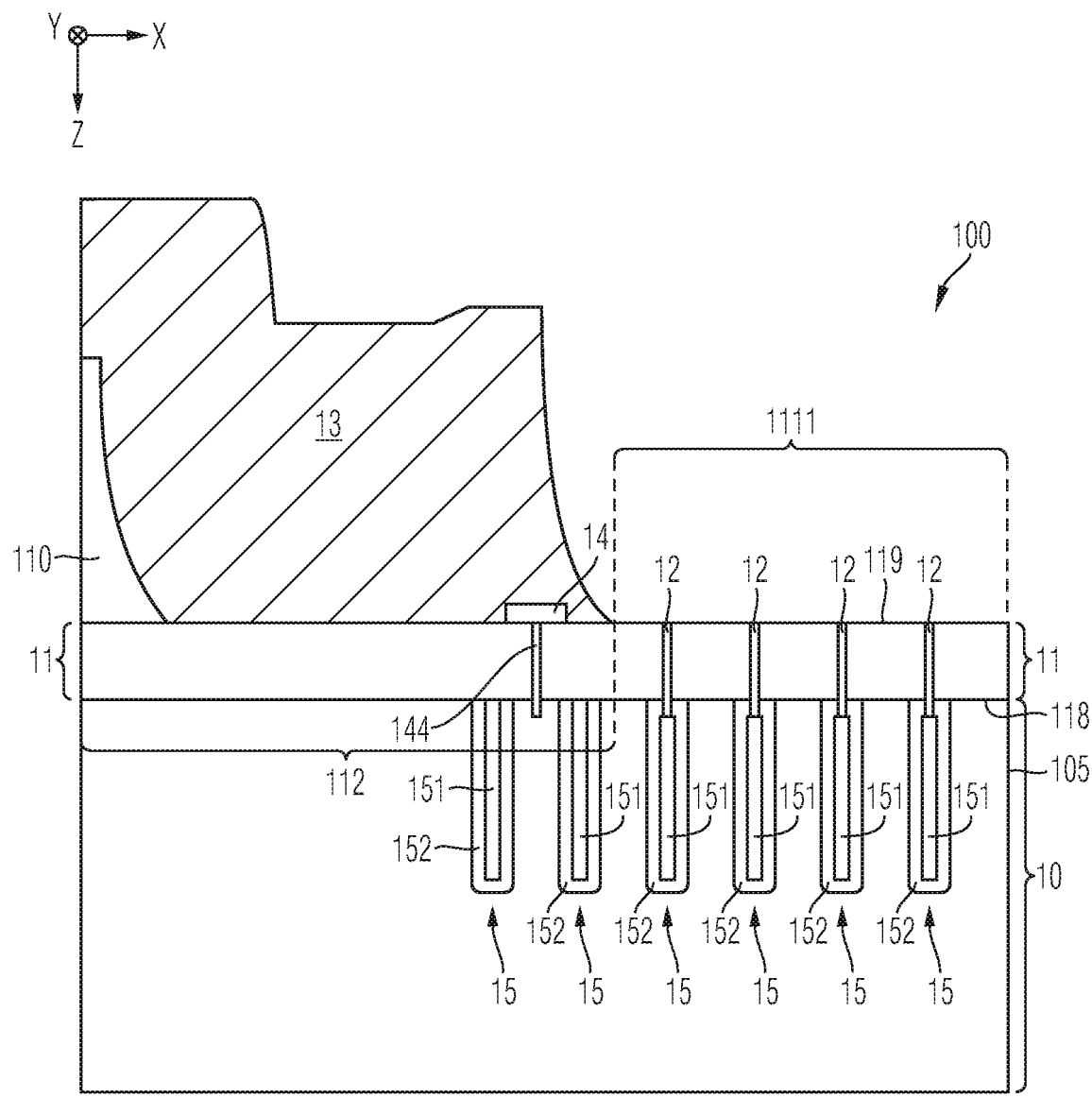
FIG. 7 schematically and exemplarily illustrates a section of a vertical cross-section of a power semiconductor die in accordance with some embodiments.

For example, each die region 210 has at least one power semiconductor die 100 (as schematically and exemplarily illustrates in FIGS. 3A-B and 7). For example, each die region 210 integrates the at least one power semiconductor die 100. Each power semiconductor die 100 may comprise one or more of the following: a diode, a transistor, a MOSFET, an IGBT, an RC-IGBT, a MGD.

For example, processing of the semiconductor wafer 200 occurs mainly at the wafer front side 290; e.g., the wafer front side 290 can be subjected to a plurality of processing steps including, for example, one or more implantation processing steps, one or more epitaxy processing steps, one or more deposition processing steps, one or more lithographic processing steps, one or more etching processing steps and the like. For example, at the wafer back side 280, a homogeneously formed (i.e. unstructured) back side metallization layer 212 is provided. For example, this metallization layer 212 forms a part of a load terminal of each power semiconductor die 100, e.g., a drain terminal, a collector terminal or a cathode terminal.

Processing the wafer front side 290 may comprise creating an insulation layer 11 on the semiconductor body 10. For example, the insulation layer 11 comprises an intermediate oxidation layer. Further, the insulation layer 11 can comprise an oxide. For example, the insulation layer 11 comprises silicon oxide ($SiO_2$) and/or a borophosphosilicate glass (BPSG). In an embodiment, the insulation layer 11 comprises a lower oxidation layer and an upper BPSG layer.

The insulation layer 11 can cover the semiconductor body 10, e.g., not only in the die regions 210, but also at the dicing regions 220. For example, the insulation layer 11 covers substantially the entire semiconductor body 10 of the wafer 200. The insulation layer 11 may be arranged in a horizontal manner, e.g., such that a transition between the insulation layer 11 and the semiconductor body defines a substantially horizontal plane. For example, both an upper surface 119 and the lower surface 118 of the insulation layer 11 define a substantially horizontal plane.

Within the die regions 210, e.g., their respective active areas (cf. reference numeral 180 in FIG. 3B), the insulation layer 11 may be locally penetrated by contact means, e.g., contact stripes and/or contact plugs, that are arranged and configured to contact a section of the semiconductor body 10, for example a source region and/or the body region and/or a channel region, or an insulated electrode. For example, as will become apparent from the description of the remaining drawings, a plurality of trenches may extend into the semiconductor body 10 along the vertical direction Z and may include insulated trench electrodes that are to be contacted. For example, such trench electrodes can include control electrodes that may need to be electrically connected to a control terminal structure, e.g., a gate runner. Further, such trench electrodes can include field electrodes that may need to be electrically connected to a load terminal structure. For example, such load terminal structure and/or such control terminal structure may be arranged above the insulation layer 11, and said contact means penetrating the insulation layer 11 may serve as an electrical connection between these terminal structures that are arranged on top of the upper surface 119 of the insulation layer 11 on the one side and, on the other side, the buried components (semiconductor regions and/or trench electrodes) that are arranged below the lower surface 118 of the insulation layer 11.

Further, the passivation structure 13 may be arranged on the insulation layer 11, e.g., exclusively within the die regions 210. For example, the passivation structure 13 covers the above mentioned control terminal structure and load terminal structure, e.g., so as to provide for an electrical insulation between these terminal structures. In an embodiment, the passivation structure 13 may include an insulating material, e.g., imide. The passivation structure 13 may be configured to provide for an encapsulation.

For example, the passivation structure 13 does not extend into the dicing regions 220. Rather, in accordance with an embodiment, the passivation structure 13 terminates within an edge termination region (cf. reference numeral 190 in FIG. 3B) of the power semiconductor die included in the respective die region 210.

As illustrated, the passivation structure 13 can be arranged above the insulation layer 11 and so as to expose the section 111 of the insulation layer 11. Further, the passivation structure 13 can be arranged above the insulation layer so as to cover a section 112 of the insulation layer 11. For example, the covered insulation layer sections 112 are exclusively arranged within the die regions 210.

The exposed insulation layer section 111 may extend into each of the die region 210 and the dicing region 220. For example, the first subsection 1111 of the exposed insulation layer section 111 extends into the die region 210. A second subsection 1112 of the exposed insulation layer section 111 can be arranged within the dicing region 220.

As explained above, the dicing region 220 can be designated to be subjected to a separation processing step, wherein, for example, a laser beam may be directed to the dicing region 220, e.g., onto the surface of the second insulation layer subsection 1112. Additionally or alternatively, a laser beam may be directed to a section of the semiconductor body 10 arranged below and laterally overlapping with the second insulation layer subsection 1112.

Thus, in an embodiment, once processing of the die regions 210 is finished, the wafer 200 may be subjected to a separation processing step, e.g., a dicing (also referred to as "sawing") processing step, such as a laser dicing processing step. During such separation processing step, the wafer 200 can be divided, along the dicing regions 220, into the separate dies which may then be packaged and shipped to the customer. For example, each dicing region 220 includes a dicing (sawing) line (not illustrated) at the second insulation layer subsection 1112, along which one or more laser beams are directed for carrying out the separation.

A width of the second insulation layer subsection 1112 along the first lateral direction X can be within the range of some 10 µm, e.g., within the range of 10 µm to 150 µm. For example, the width of the second insulation layer subsection 1112 is chosen such that a laser beam with a diameter of, e.g., 20 µm and a lateral deviation of, e.g., +/−20 µm can be guided along the second insulation layer subsection 1112, e.g., without subjecting the first insulation layer subsection 1111 to the laser beam.

In accordance with an embodiment, the semiconductor wafer 200 includes an interruption structure 12 in the first insulation layer subsection 1111. The interruption structure 12 may interrupt the insulation layer 11. For example, the interruption structure 12 divides the insulation layer 11 into separate subregions.

For example, the interruption structure 12 is arranged in a position not covered by the passivation structure 13. The interruption structure 12 may be arranged at a visible position. The interruption structure 12 can be configured to block a lateral peel-off-process of the insulation layer 11, wherein the lateral peel-off-process can be an uncontrolled process. For example, such (uncontrolled) peel-off-process can be initiated by said separation processing step, e.g., by means of a laser beam directed onto the second insulation layer subsection 1112 or (as mentioned above) by means of a laser beam directed onto the semiconductor body 10 below the second insulation layer subsection 1112. In accordance with such peel-off-process, a peeling may propagate laterally, e.g., in and against the first lateral direction X. Such laterally propagating peeling may be blocked by means of the interruption structure 12, in accordance with an embodiment. For example, since the interruption structure 12 may be arranged in a visible position, it can be visually checked whether or not the peel-off-process has been effectively blocked by the interruption structure 12. For example, the interruption structure is further configured to avoid that the peel-off-process propagates until below with the passivation structure 13.

For example, when dicing the semiconductor wafer 200 along the dicing regions 220, the interruption structure 12 is at least partially maintained. E.g., the laser beam is not pointed onto all parts of the interruption structure 12, but guided so as to not entirely destroy the interruption structure 12.

Further optional features of the interruption structure 12 will be explained also with respect to the remaining drawings.

FIG. 3A schematically and exemplarily illustrates a vertical cross-section of a power semiconductor die 100 and FIG. 3B schematically and exemplarily illustrates horizontal projection of the power semiconductor die 100 in accordance with one or more embodiments. In the following, it will be referred to both FIG. 3A and FIG. 3B.

For example, the power semiconductor die 100 has been a part of the semiconductor wafer 200 and has been cut out of the semiconductor wafer 200, wherein, thereby, the die edge 105 may have become into being. As illustrated, the power semiconductor die 100 may have an active region 180 and an edge termination region 190 that surrounds the active region 180 and that is terminated by the die edge 105. The passivation structure 13 may be arranged so as to cover substantially the entire active region 180 and, only partially, the edge termination region 190. Of course, the passivation structure 13 may be partially structured within the active region 180, e.g., so as to allow external contacts, e.g., bonding wires, to contact a load terminal structure and/or a control terminal structure arranged on the insulation layer 11, e.g. load terminal structure 110. As explained above, the back side metallization 212 mentioned with respect to FIG. 1 can form another load terminal structure of the power semiconductor die 100, e.g. load terminal structure 120 at the back side of the power semiconductor die 100.

As further explained above, when separating the wafer 200 into the plurality of power semiconductor dies 100, the interruption structure 12 may be at least partially maintained. As illustrated in FIG. 3A, the interruption structure 12 is arranged within the first insulation layer subsection 1111 that is not covered by the passivation structure 13.

In accordance with an embodiment, the interruption structure 12 extends from the upper surface 119 of the insulation layer 11 at least to the lower surface 118 of the insulation layer 11. For example, the interruption structure 12 may even extend slightly further along the vertical direction Z as a lower surface 118, e.g., so as to contact at least one of the semiconductor body 10 and a trench electrode, as will be explained in more detail further below.

In an embodiment, the interruption structure 12 comprises a material (e.g., a gaseous material or a solid material) different from the material of the insulation layer 11. For example, the interruption structure 12 includes one or more passages that extend from the upper surface 119 to the lower surface 118. For example, these one or more passages can be left empty or, respectively, be filled, at least partially, with a material different from the material of the insulation layer 11.

In another embodiment, the one or more passages of the interruption structure 12 is/are filled with an electrically conductive material, e.g., a metal. For example, the interruption structure 12 may comprise a contact plug or, respectively, a contact stripe for contacting the semiconductor body 10 and/or a trench electrode.

In another embodiment, the one or more passages of the interruption structure 12 is/are filled with an insulating material that is different from the material of the insulation layer 11. For example, the one or more passages is/are filled with imide.

For example, the one or more passages of the interruption structure 12 each exhibit a width, e.g., along the first lateral direction X, of at least 100 nm and of no more than 200 µm. e.g., so as to reliably divide/rip the insulation layer 11.

Irrespective of whether the passages of the interruption structure 12 are filled or not, the interruption structure 12 can be configured, as elucidated above, to interrupt the insulation layer 11 e.g., so as to divide the insulation layer 11 into a section facing to the die edge 105 and into a section facing to the passivation structure 13.

For example, the interruption structure 12 may entirely or at least partially surround the edge termination region 190, as illustrated in FIG. 3B. Thereby, the interruption structure 12 also entirely or at least partially surrounds the active region 180 of the power semiconductor die 100. For example, in order to at least partially surround the edge termination region 190, the interruption structure 12 may comprise an arrangement of a plurality of contacts stripes that are coupled to each other so as to form a substantially closed structure that, e.g., at least partially surrounds the edge termination region 190. For example, in accordance with the embodiment schematically illustrated in FIG. 4, four contact stripes are arranged so as to form a closed rectangular that surrounds the edge termination region 190. In another embodiment, the corners must not necessarily be closed; rather, contact stripes that extend perpendicular to each other can define an open corner.

Figure 4:
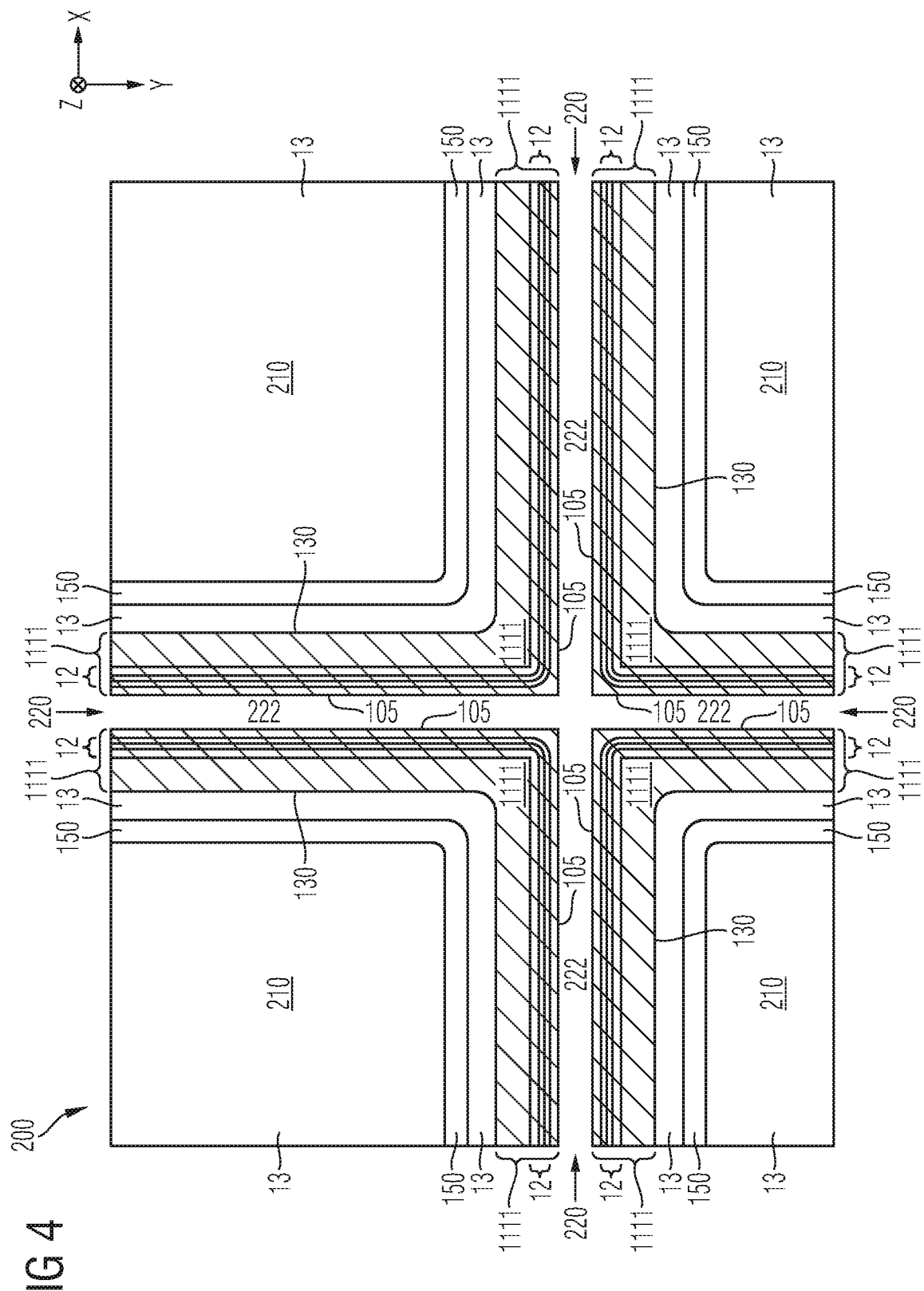
FIG. 4 schematically and exemplarily illustrates a section of a horizontal projection of a semiconductor wafer in accordance with some embodiments.

FIG. 4 schematically and exemplarily illustrates a section of a horizontal projection of an embodiment of the semiconductor wafer 200, said section including four adjacent die regions 210. For example, a first dicing processing step has been carried out along dicing lines 222 in dicing regions 220. For example, due to such first dicing processing step, the second insulation layer subsection 1112 (cf. FIG. 1) may have been removed. The crosshatched area illustrates the first insulation layer subsections 1111 that extend laterally from the respective die edges 105 to an outermost termination 130 of the passivation structures 13. As explained above, the interruption structure 12 of each power semiconductor die 100, i.e., of each die region 210, may include a plurality of contact stripes arranged co-parallel to each other. These contact stripes are not covered by the passivation structure 13, as illustrated. As mentioned above, in contrast to the schematic illustration of FIG. 4, the contact stripes may but must not necessarily contact each other at the corners. For example, in another embodiment, the contact stripes that extend perpendicular to each other define open corners.

As has further been explained above, the passivation structure 13 may be structured, e.g., so as to expose a terminal structure, e.g., terminal structure 150, which may be a control terminal structure, and comprise, for example, a gate runner.

Figure 5:
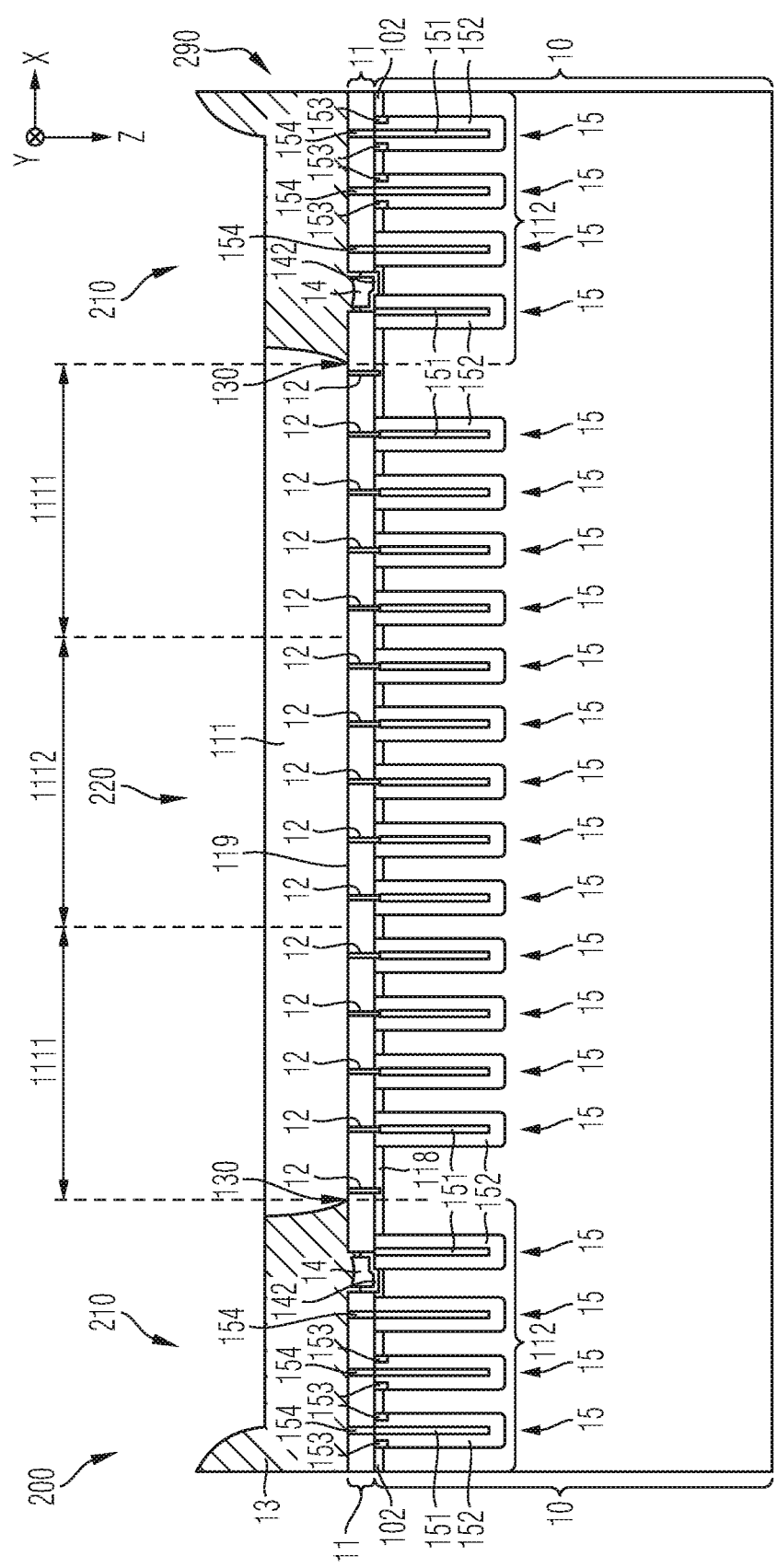
FIGS. 5-6 each schematically and exemplarily illustrate a section of a vertical cross-section of a semiconductor wafer in accordance with some embodiments.

FIG. 5 schematically and exemplarily illustrates a section of a vertical cross-section of an embodiment of the semiconductor wafer 200 with two adjacent die regions 210.

Accordingly, a plurality of trenches 15 may extend into the semiconductor body 10 along the vertical direction Z. Each of the plurality of trenches 15 may include a trench electrode 151 and a trench insulator 152 that insulates the trench electrode 151 from the semiconductor body 10. The trenches 15 may be arranged both within the die regions 210 and within the dicing region 220.

For example, a first subset of the plurality of trenches 15 can be arranged in the die region 210, wherein, in each of FIGS. 5-8, only a respective section of the edge termination regions (cf. reference numeral 190 in FIG. 3B is illustrated). The first subset can include at least one trench 15 that laterally overlaps with the first insulation layer subsection 1111. In the illustrated embodiment, four trenches 15 laterally overlap with the first insulation layer subsection 1111 in the die region 210.

A second subset of the plurality of trenches 15 can be arranged in the dicing region 220, wherein each of the second subset of the plurality of trenches 15 laterally overlaps with the second insulation layer subsection 1112.

In accordance with an embodiment, the first subset of the plurality of trenches 15 and the second subset of the plurality of trenches 15 are of identical spatial dimensions, e.g., with respect to the total extension along the vertical direction Z and/or with respect to the trench width along the first lateral direction X. Additionally or alternatively, the first subset of the plurality of trenches 15 and the second subset of the plurality of trenches 15 are arranged in accordance with the same trench pattern, e.g., with respect to a lateral distance along the first lateral direction X between two adjacent trenches 15 (also referred to as "pitch" herein). In another embodiment, the trenches 15 within the dicing regions 220 can be arranged in accordance with a greater pitch as compared to the trenches 15 within the die regions 210.

For example, the trench formation process carried out for forming the trenches within the active region 180 of each power semiconductor die 100 of the die regions 210, e.g., for forming control trenches, gate trenches, field plate trenches and the like, is simultaneously carried out, in a similar or identical fashion, within the dicing regions 220, which can be beneficial regarding uniformity. Thus, even though such trenches 15 in the dicing regions 210 are not needed for controlling operation of the power semiconductor dies 100, they may nevertheless be formed within these regions 220 so as to provide for a high uniformity within the entire wafer 200.

In accordance with an embodiment, the interruption structure 12 may electrically contact the trench electrode 151 of the at least one trench 15 that laterally overlaps with the first insulation layer subsection 1111. Additionally or alternatively, the interruption structure 12 may electrically contact a semiconductor region adjacent to the trench insulator 152 of the at least one trench that laterally overlaps with the first insulation layer subsection 1111, e.g., a doped semiconductor region 102 arranged in a mesa zone between two adjacent trenches 15.

In an embodiment, a plurality of contact plugs 154 is employed for contacting the trench electrodes 151 and/or the semiconductor body 10, wherein each of the contact plugs 154 may extend from the upper surface 119 of the insulation layer 11 to the lower surface 118 of the insulation layer 11. The use of such contact plugs 154 is generally known to the skilled person. For example, depending on the design of the power semiconductor dies 100, e.g., a needle trench design or a stripe trench design, such contact plugs 154 may be configured as contact stripes or as contact needles. They may penetrate through the insulation layer 11 and extend further along the vertical direction Z as compared to the lower surface 118 of the insulation layer 11, e.g., so as to contact a region of the semiconductor body 10, e.g., a source region, a channel region or the body region within the active region 180.

For example, as illustrated in FIG. 7, a frontside metallization 110 is arranged above the insulation layer 11 and below the passivation structure 13, wherein the frontside metallization 110 is electrically connected to the semiconductor body 10 in the active region 180 of the power semiconductor die 100. This front side metallization 110 may form a part of a load terminal structure of the power semiconductor die 100, e.g., a part of a source terminal structure, an emitter terminal structure or an anode terminal structure. As already explained, the active region 180 can be laterally displaced from the first insulation layer subsection 1111. For example, in order to provide for said electrical connection between the front side metallization 110 and the semiconductor body 10 and/or between the front side metallization 110 and the trench electrodes 151, said contact plugs 154 may be employed.

In accordance with an embodiment, the interruption structure 12 is produced simultaneously and in an identical manner or, respectively in a similar manner as the contact plugs 154.

For example, the interruption structure 12 may include a plurality of contact plugs 154 that are arranged within the dicing region 220, wherein each of the contact plugs 154 of the interruption structure 12 may penetrate the insulation layer 11, namely within the exposed insulation layer section 111 and, e.g., within both the first insulation layer subsection 1111 and the second insulation layer subsection 1112, wherein each of the contact plugs 154 of the interruption structure 12 may contact either the semiconductor body 10 below the lower surface 119 of the insulation layer 11 (e.g., a doped semiconductor region 102) or one of the trench electrodes 151.

In other words, at least one of the trenches 15 laterally overlaps with first insulation layer subsection 1111, wherein the contact plug 154 that electrically contacts the trench electrode 151 of this at least one trench 15 or a semiconductor region adjacent to the trench insulator 152 of this at least one trench 15 may form a part of the interruption structure 12.

Figure 6:
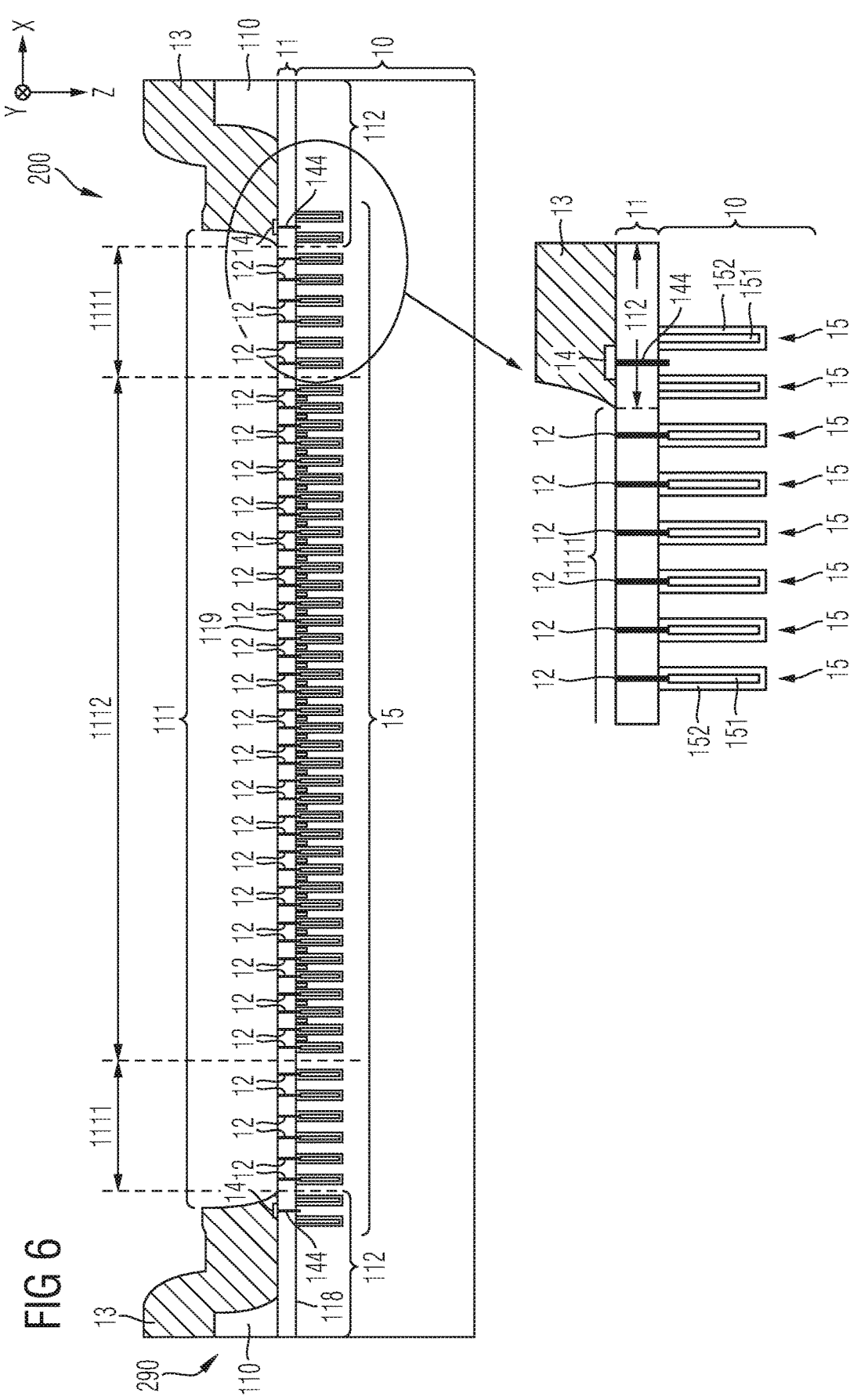

In accordance with the embodiments schematically and exemplarily illustrated in each of FIGS. 5-7, a further interruption structure 14 may be provided that is covered by the passivation structure 13. For example, also this first interruption structure 14 may penetrate the insulation layer 11, e.g., at the covered insulation layer section 112. As illustrated in FIGS. 6 and 7, the further interruption structure 14 may comprise a further interruption contact plug 144, as illustrated in FIG. 5, or a further interruption contact well 142, wherein the contact plug 144 or, respectively the contact well 142 may electrically contact the semiconductor body 10.

The total number of trenches 15 included in the dicing region 220 may depend on a trench pattern that is being employed for forming the trenches in the die region 210. For example, the power semiconductor dies with a lower voltage rating, the trench pattern with a comparatively small pitch may be employed (cf. FIG. 6), whereas for power semiconductor dies with a higher voltage rating, the trench but in with a comparatively larger pitch may be employed (cf. FIG. 5).

Further, as illustrated in FIG. 6, the plurality of trenches 15 may comprise at least two different trench types, e.g., trenches of a control trench type and trenches of a field plate trench type. For example, the field plate trenches are significantly larger, e.g., in terms of the total vertical extension, as compared to the control trenches. The control trenches may include insulated control trench electrodes, wherein the field plate trenches may include larger field plate trench electrodes that are electrically connected, at least in the active region 180 of the respective power semiconductor die 100, to the front side metallization 110. The interruption structure 12 may comprise a plurality of contact plugs that extend through the second insulation layer subsection 1112, e.g., so as to contact the semiconductor body 10, the control trench electrodes and/or the field plate trench electrodes.

Figure 8:
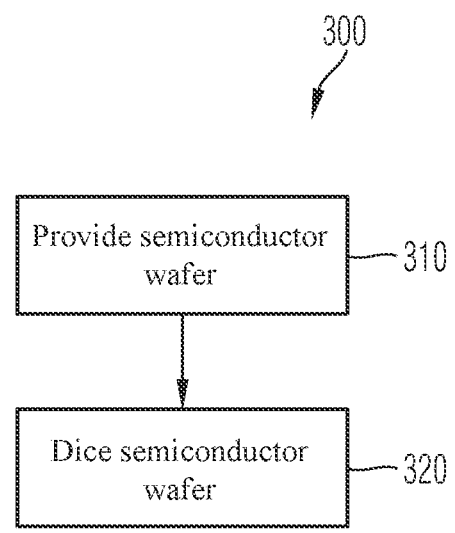
FIG. 8 schematically and exemplarily illustrates a flow diagram of a method of processing a semiconductor wafer in accordance with some embodiments.

Presented herein is also a method, an embodiment of which is schematically and exemplarily illustrated in FIG. 8. For example, method 300 comprises: providing, in step 310, a semiconductor wafer. The provided semiconductor wafer has: a semiconductor body; an insulation layer on the semiconductor body; a die region with a power semiconductor die; a dicing region arranged adjacent to the die region; a passivation structure arranged above the insulation layer and so as to expose a section of the insulation layer, wherein a first subsection of the exposed insulation layer section extends into the die region and wherein a second subsection of the exposed insulation layer section extends into the dicing region; and an interruption structure in the first insulation layer subsection. Method 300 may further comprise dicing, in step 320, the semiconductor wafer along the dicing region while at least partially maintaining the interruption structure Features of exemplary embodiments of the method 300 may correspond to the features of the exemplary embodiments of the power semiconductor die 100 and/or to the features of the exemplary embodiments of the semiconductor wafer 10 described above. And so far, it is referred to the aforesaid.

For example, when carrying out the method 300, it is ensured that the interruption structure (cf. reference numeral 12 in the other drawings) is not covered, e.g., not only by means of the passivation structure (cf. reference numeral 13 and the other drawings), but also not by another layer or the like. For example, it is thereby ensured that the interruption structure provides for a visible perceivable control element for checking of whether or not the above described laterally propagating peel-off-process has been effectively blocked by the interruption structure.

Step 320 may include carrying out at least one first laser dicing processing step, e.g., so as to break up the exposed insulation layer section (cf. reference numeral 112), e.g. along dicing lines (cf. reference numeral 222) included in the dicing regions. For example, by means of the first laser dicing processing step, also an upper section of the semiconductor body 10, e.g., the upper 10 μm of semiconductor body 10, that is arranged below the second insulation layer subsection 1112 may also be removed, e.g., including the trenches 15 that have been implemented in this upper section. Thereafter, a second laser dicing processing step can be carried out, e.g., so as to cut through the semiconductor body and the back side metallization (cf. reference numeral 212).

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor die, comprising:
a semiconductor body;
an insulation layer on the semiconductor body;
a passivation structure arranged above the insulation layer so as to expose a first insulation layer subsection of the insulation layer that extends to an edge of the power semiconductor die;
an interruption structure in the first insulation layer subsection;
a plurality of trenches, wherein each of the trenches includes a trench electrode that is insulated from the semiconductor body by a trench insulator; and
a plurality of contact plugs for contacting the trench electrodes and/or the semiconductor body, wherein each of the contact plugs extends from the upper surface of the insulation layer to the lower surface of the insulation layer.

2. The power semiconductor die of claim 1, wherein the interruption structure extends from an upper surface of the insulation layer at least to a lower surface of the insulation layer.

3. The power semiconductor die of claim 1, wherein the interruption structure comprises a material different from the material of the insulation layer.

4. The power semiconductor die of claim 1, wherein the interruption structure comprises a contact plug for contacting one of the semiconductor body and a trench electrode.

5. The power semiconductor die of claim 1, wherein the interruption structure is configured to block a lateral peel-off-process of the insulation layer.

6. The power semiconductor die of claim 1, wherein the interruption structure is arranged in a position not covered by the passivation structure.

7. The power semiconductor die of claim 1, wherein the interruption structure interrupts the insulation layer.

8. The power semiconductor die of claim 1, wherein the interruption structure surrounds an edge termination region of the power semiconductor die.

9. The power semiconductor die of claim 1, wherein the interruption structure comprises an arrangement of a plurality of contact stripes that are coupled to each other and form a substantially closed structure.

10. The power semiconductor die of claim 1, further comprising a frontside metallization arranged above the insulation layer and below the passivation structure, and wherein the frontside metallization is electrically connected to the semiconductor body in an active region of the power semiconductor die that is laterally displaced from the first insulation layer subsection.

11. The power semiconductor die of claim 10, wherein at least some of the contact plugs are electrically connected to the frontside metallization.

12. The power semiconductor die of claim 1, wherein at least one of the trenches laterally overlaps with the first insulation layer subsection, and wherein one of the contact plugs electrically contacts the trench electrode of the at least one trench or contacts a semiconductor region adjacent to the trench insulator of the at least one trench and forms a part of the interruption structure.

13. The power semiconductor die of claim 1, further comprising a frontside metallization arranged above the insulation layer and below the passivation structure, and wherein the frontside metallization is electrically connected to the semiconductor body in an active region of the power semiconductor die that is laterally displaced from the first insulation layer subsection.

14. The power semiconductor die of claim 1, wherein the passivation structure comprises imide, and/or wherein the insulation layer includes a borophosphosilicate glass, and/or wherein the interruption structure includes a metal.

15. The power semiconductor die of claim 1, further comprising:
 a plurality of contact plugs for contacting the semiconductor body, wherein each of the contact plugs extends from the upper surface of the insulation layer to the lower surface of the insulation layer, and wherein the contact plugs are omitted from an edge termination region of the power semiconductor die.

16. The power semiconductor die of claim 15, wherein the contact plugs are uncovered by the passivation structure.

17. A semiconductor wafer, comprising:
 a semiconductor body;
 an insulation layer on the semiconductor body;
 a die region with a power semiconductor die;
 a dicing region arranged adjacent to the die region;
 a passivation structure arranged above the insulation layer so as to expose a section of the insulation layer, wherein a first subsection of the exposed insulation layer section extends into the die region and wherein a second subsection of the exposed insulation layer section extends into the dicing region;
 an interruption structure in the first insulation layer subsection; and
 a plurality of trenches, wherein each of the trenches includes a trench electrode that is insulated from the semiconductor body by a trench insulator, wherein a first subset of the plurality of trenches is arranged in the die region and includes at least one trench laterally overlapping the first insulation layer subsection, wherein a second subset of the plurality of trenches is arranged in the dicing region, and wherein each of the second subset of the plurality of trenches laterally overlaps with the second insulation layer subsection.

18. The semiconductor wafer of claim 17, wherein the first subset of the plurality of trenches and the second subset of the plurality of trenches are of identical spatial dimensions, and/or wherein the first subset of the plurality of trenches and the second subset of the plurality of trenches are arranged in accordance with the same trench pattern.

19. The semiconductor wafer of claim 17, wherein the interruption structure electrically contacts: the trench electrode of the at least one trench that laterally overlaps with the first insulation layer subsection and/or a semiconductor region adjacent to the trench insulator of the at least one trench that laterally overlaps with the first insulation layer subsection.

* * * * *